(12) United States Patent
Park et al.

(10) Patent No.: US 6,186,344 B1
(45) Date of Patent: *Feb. 13, 2001

(54) CASSETTE FOR LOADING GLASSES FOR LIQUID CRYSTAL DISPLAY DEVICE

(75) Inventors: Byung-Kwen Park, Suwon; Sung-Cue Choi, Kyungki-do, both of (KR)

(73) Assignee: Samsung Electronics Co., Ltd., Kyungki-do (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/708,223

(22) Filed: Sep. 6, 1996

(30) Foreign Application Priority Data

Sep. 7, 1995 (KR) .................................. 95-29445

(51) Int. Cl.[7] .................................. A47G 19/08
(52) U.S. Cl. .................... 211/41.1; 211/41.18; 211/41.14
(58) Field of Search .............................. 211/41.1, 41.14, 211/41.18, 41.2; 118/500; 349/187; 359/83

(56) References Cited

U.S. PATENT DOCUMENTS

| 1,211,269 | * | 1/1917 | Abbott | 211/41.2 X |
| 4,574,959 | * | 3/1986 | Hollett | 211/41.1 |
| 5,219,079 | * | 6/1993 | Nakamura | 211/41.18 |
| 5,393,226 | * | 2/1995 | Groom | 211/41.2 |
| 5,584,401 | * | 12/1996 | Yoshida . | |

FOREIGN PATENT DOCUMENTS

| 2613163 | * | 10/1977 | (DE) | 211/41.2 |
| 54-92350 | | 11/1952 | (JP) . | |
| 1-265534 | | 10/1989 | (JP) . | |
| 5-147680 | | 6/1993 | (JP) . | |
| 5-267202 | | 10/1993 | (JP) . | |
| 6-40481 | | 2/1994 | (JP) . | |
| 8-88266 | | 4/1996 | (JP) . | |
| 8-195352 | | 7/1996 | (JP) . | |

* cited by examiner

Primary Examiner—Blair M. Johnson
(74) Attorney, Agent, or Firm—Pillsbury Madison & Sutro LLP

(57) ABSTRACT

The present invention discloses a cassette for loading glasses, the cassette capable of preventing the bending phenomena of the glasses due to its weights, and capable of discharging the static electricity formed on the glasses and cassette, and capable of preventing the drifting away of the glasses via front side of the cassette. The cassette includes a plurality of side plate which are parallel to each other and having a plurality of slot for loading the glasses therein. And a top plate is connected to one ends of the plurality of side plate and a bottom plate is connected to second ends of the plurality of side plate. In addition a plurality of supporting bar, which is prolonged to support the glasses, are formed on said plurality of side plate. The plurality of side plate, the top plate, the bottom plate and the plurality of supporting bar are made of a metal conductor and a conductive resin to discharge the static electricity formed on the glasses and the cassette.

14 Claims, 6 Drawing Sheets

CASSETTE FOR LOADING GLASSES FOR LIQUID CRYSTAL DISPLAY DEVICE

BACKGROUND OF THE INVENTION (1). Field of the Invention

The present invention relates to a cassette for loading glasses for liquid crystal displays and a method for discharging electrostatic charges generated in glasses.

(2). Description of the Prior Art

Nowadays, a liquid crystal display is widely used due to its properties of slim thickness, light weight and low power consumption. In manufacturing the liquid crystal display, a glass is used as a back-frame of the device and the step of transferring the glass is necessary. When the glasses are transferred to another place, they are loaded on cassettes and the cassettes are carried by men or machines.

Hereinafter, the cassette for loading and carrying the glasses will be explained with reference to the attached drawings.

FIG. 1 is a perspective view of a conventional cassette for loading the glasses, and FIGS. 2 and 3 are a front and a side view of the conventional cassette shown in FIG. 1, respectively.

As shown in FIGS. 1 to 3, the conventional cassette 10 for loading the glasses comprises side plates 11 having slots 15 formed of protrusions 15' for loading the glasses therein, a bottom board 12 and a top board 13. The cassette 10 further includes stoppers 14 for preventing the drifting away of the glasses from the cassette 10 when carrying the glasses in the cassette 10, and handles 16 for convenient carrying the cassette 10. In operation, a user loads the glasses on the cassette 10 by inserting the glasses in the slots 15 of the side plates 11. After loading the glasses on the cassette 10, the user carries the cassette 10 with maintaining the front side of the cassette 10 to be a little up in order to preventing the sliding away of the glasses from the cassette via the front side of the cassette 10. It is because the conventional cassette 10 has no element for blocking the sliding away of the glasses via the front side of the cassette 10. Accordingly, if the cassette 10 leans to the front side, the glasses loaded on the cassette 10 may slide down and fall off from the cassette 10 and may be broken. Therefore, the user should pay attention to prevent the leaning of the cassette 10 to the front side when carrying the cassette 10. In addition, since the conventional cassette supports only the edges of glasses with the protrusions 15' having short length, the central parts of the glasses is bent due to their weight. FIG. 4 shows the bent glasses 17 loaded on the conventional cassette 10, and the extent of bending of the glasses 17 having various sizes and thicknesses were measured and listed in the following table 1.

TABLE 1

| SIZE OF GLASS (mm²) | THICKNESS OF GLASS | Unit: mm EXTENT OF BENDING |
|---|---|---|
| 370 | 1.1 | 1.15 |
| 550 | 1.1 | 3.3 |
| 550 | 0.7 | 9.05 |

As shown in table 1, in case of the widely used liquid crystal display which is slim and of big size, the extent of bending is large, and it deteriorates the quality of the device.

In addition, the conventional cassette does not effectively eliminate the static electricity generated on the glasses when the glasses are loaded on the cassette. FIGS. 5A and 5B are the figures to show the parts of the glass where the electricity generated. FIG. 5A shows the front view of the glass and FIG. 5B shows the top view of the glass. The measured voltages due to static electricity according to the parts of the glass are shown in the following table 2. These values are measured 2 days after loading the glasses on the conventional cassette.

TABLE 2

| POSITION | A, a | B, b | UNIT: kV C, c |
|---|---|---|---|
| EDGE OF GLASS | 0.58 | 1.72 | 0.52 |
| SURFACE OF GLASS | 0.27 | 0.45 | 0.28 |

Even though the measured value of the static electricity may vary due to the conditions of measurements, it is clearly shown in table 2 that the static electricity generated on parts b and B in FIGS. 5A and 5B has higher values than those on the parts a, A and C, c of the glass. It means that the central part and the front side of the glass which may be easily in contact with the materials charged with electricity would have higher electricity. The static electricity is increased by the contact of the glass with a human body or other facilities. Table 3 shows that the variation of the static electricity of part B of FIG. 5B before and after the contact of the glass with the human body.

TABLE 3

| TIME | 10 min | 20 min | UNIT: kV 30 min |
|---|---|---|---|
| BEFORE THE CONTACT | 0.45 | 0.45 | 0.45 |
| AFTER THE CONTACT | 0.58 | 0.78 | 0.65 |

Generally, it is known that the static electricity generated on the glass and the slot of the cassette has the value between 200V and 2980V.

SUMMARY OF THE INVENTION

Therefore, an object of the present invention is to provide a cassette for loading glasses capable of preventing the bending phenomena of the glasses due to their weights. Another object of the present invention is to provide a cassette for loading glasses capable of discharging the static electricity generated on the glasses and the cassette. A further object of the present invention is to provide a cassette for loading glasses for preventing the drifting away of the glasses via the front side of the cassette.

According to the present invention, the cassette includes a plurality of side plates which are parallel to each other and have a plurality of slots formed of first protrusions for loading the glasses therein. A top plate is combined with first ends of said side plates and a bottom plate is combined with second ends of said side plates. In addition, a plurality of supporting bars extend horizontally from the side plates to support the glasses. In the embodiment, the cassette further includes at least one post which is combined with the top plate and the bottom plate to prevent drifting away of the glasses from the cassette.

In accordance with another embodiment of the present invention, a blocker is provided, which is combined with the front side plates. The blocker has a plurality of second protrusions which are placed near the first protrusions and located at higher position to prevent drifting away of the glasses via the front side of the cassette.

In accordance with a further embodiment of the present invention, the side plates, the top plate, the bottom plate and the supporting bars of the cassette are electrically connected through an electrical conductor.

BRIEF DESCRIPTION OF THE DRAWINGS

These and other features and advantages of the present invention may be better and more completely understood by studying the following detailed description of the presently preferred embodiments with the appended drawings, of which.

DETAILED DESCRIPTION OF THE PREFERRED EMBODIMENTS

Preferred embodiments of the present invention are described below with reference to the accompanying drawings.

Figure 1:
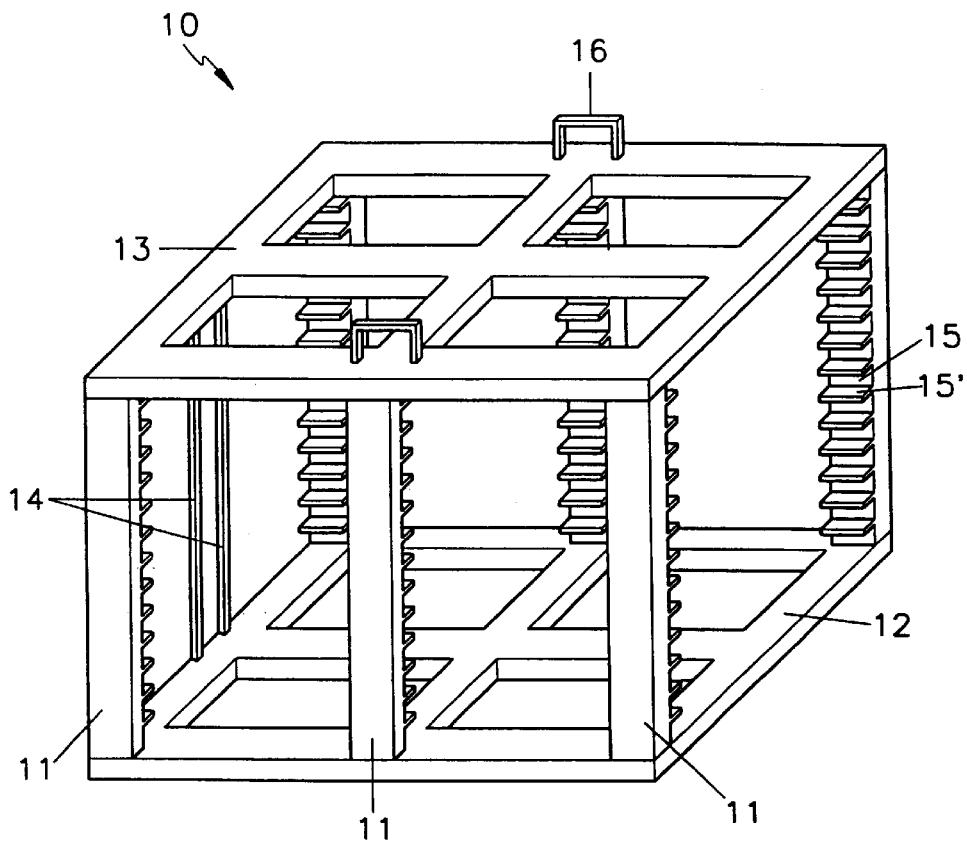
FIG. 1 is a perspective view of a conventional cassette for loading the glasses.
Figure 2:
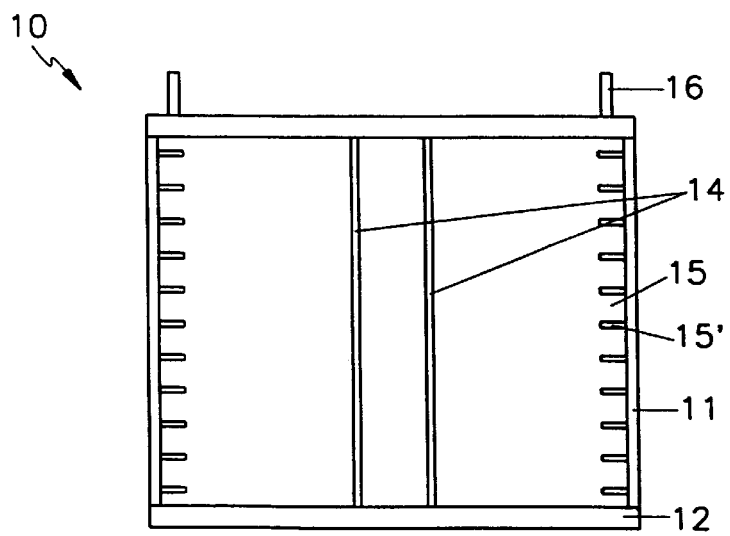
FIG. 2 is a front view of the conventional cassette shown in FIG. 1.
Figure 3:
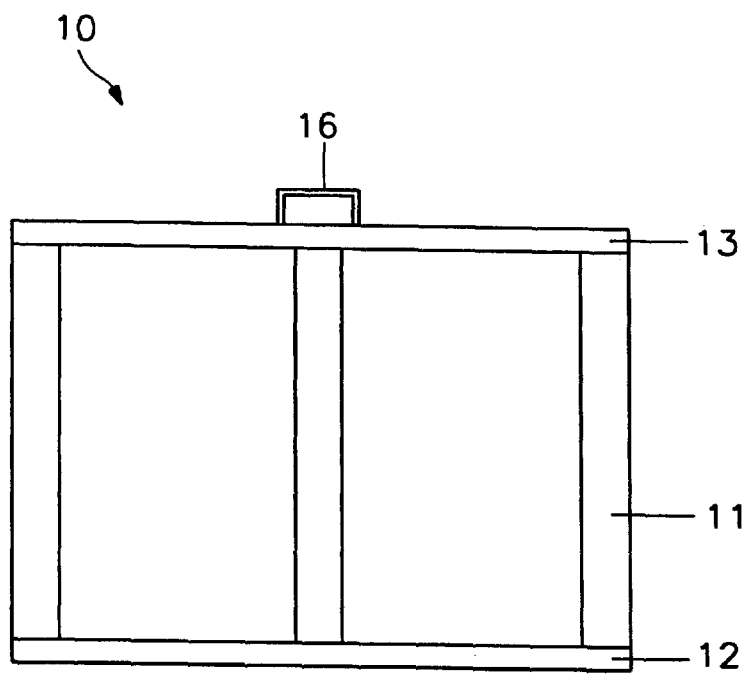
FIG. 3 is a side view of the conventional cassette shown in FIG. 1.
Figure 4:
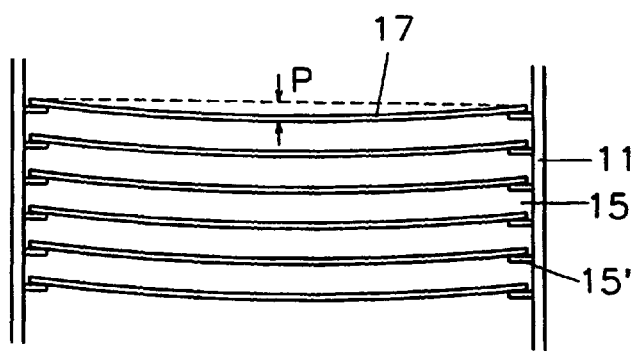
FIG. 4 shows the phenomena of bending of glasses after loading the glasses on the conventional cassette shown in FIG. 1.
Figure 5A:
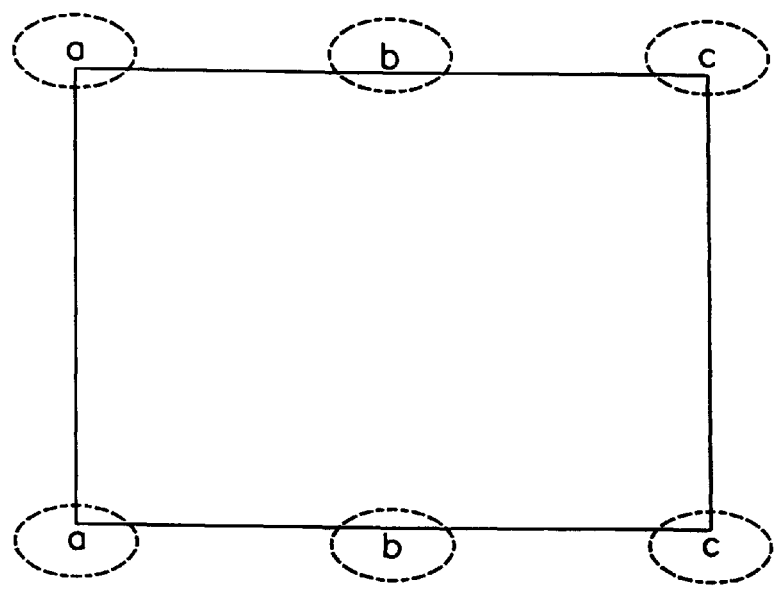
FIG. 5A shows the parts of edge of the glass where a static electricity generated.
Figure 5B:
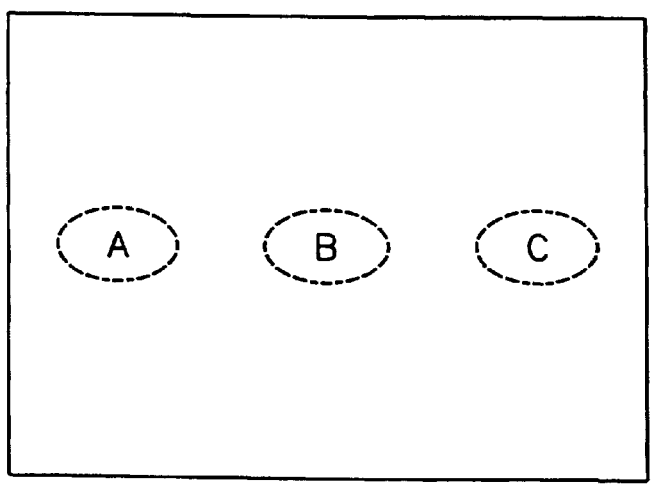
FIG. 5B shows the parts of surface of the glass where a static electricity generated.
Figure 6:
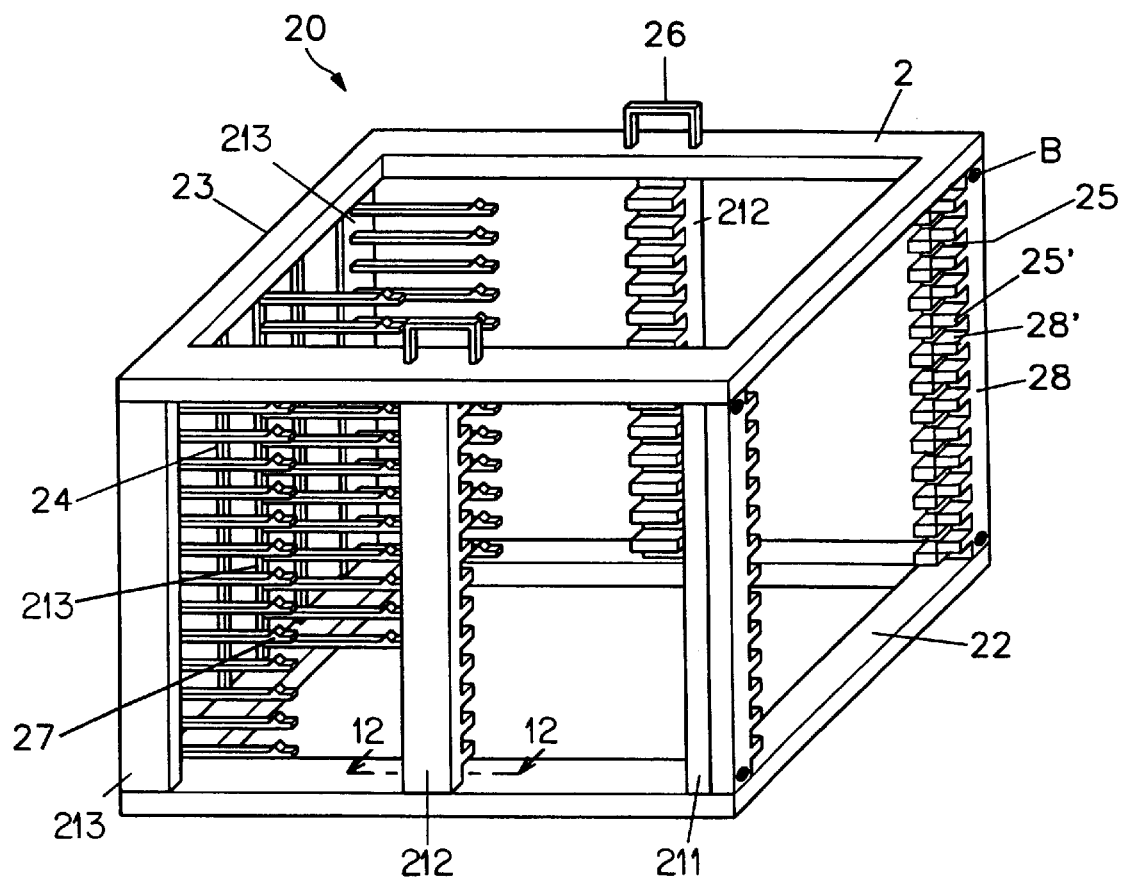
FIG. 6 is a perspective view of a cassette for loading the glasses according to an embodiment of this invention.

As shown in FIGS. 6 to 9, a cassette 20 for loading glasses according to an embodiment includes a top plate 23 and a bottom plate 22 which have rectangular shapes and are opposite each other, and the rectangle has a front edge, a rear edge and two middle edges. A plurality of side plates, front, middle and rear side plates 211, 212 and 213 which are parallel to each other stand vertically. Each side plate 211, 212 or 213 has a top end and a bottom end which are combined respectively with the top plate 23 and the bottom plate 22. In this embodiment, four of the side plates are located at the apexes of the rectangle, and three are located in the middle of the rear edge and the middle edges. The front and the middle side plates 211 and 212 at the front and the middle edges have a plurality of slots 25 for loading the glasses 29 therein, which are formed of protrusions 25'. In addition, a plurality of supporting bars 27 extend in a horizontal direction from the three rear side plates 213 at the rear edge. The length of the supporting bar 27 is larger than that of the protrusions 25'. The cassette 20 may further include at least one post 24 which is combined with the top plate 23 and the bottom plate 22 to prevent drifting away of the glasses from the cassette. As shown in FIG. 6, two posts 24 are vertically formed on the backside of the cassette 20 in this embodiment.

Figure 8:
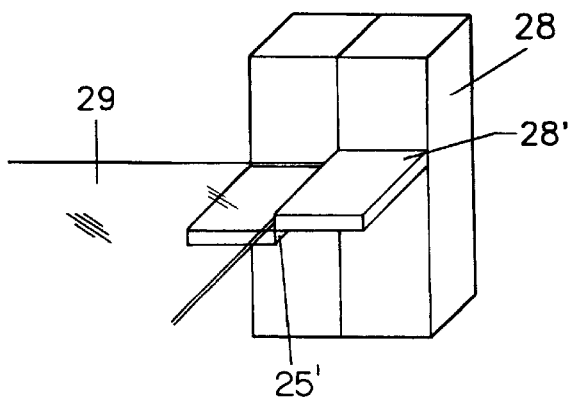
FIG. 8 shows the combined structure of a side plate and a blocker according to an embodiment of this invention.
Figure 9:
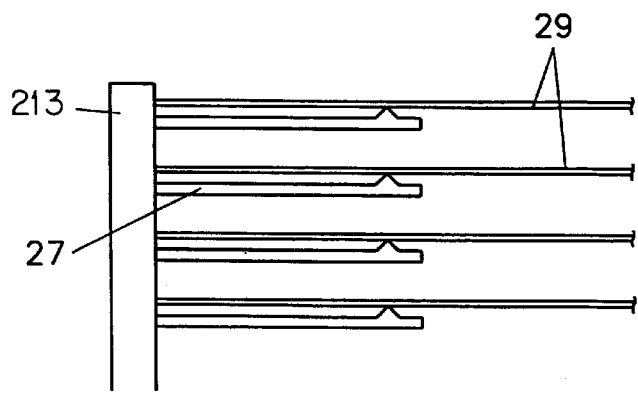
FIG. 9 shows an operation of a supporting bar according to an embodiment of this invention.

In this embodiment, blockers 28 are provided, which are combined with the front side plates 211 in front of the cassette 20, and have a plurality of protrusions 28'. The protrusions 28' are placed near the protrusions 25' of the side plates 211, and located at slightly higher positions than the protrusions 25', in order to prevent drifting away of the glasses in the cassette 10 via the front side of the cassette 20 as shown in FIG. 8. By forming the protrusions 28', a user can take out the glasses 29 without separating the blockers 28. The cassette 20 further includes two handles 26 on the top plate 23.

Figure 7:
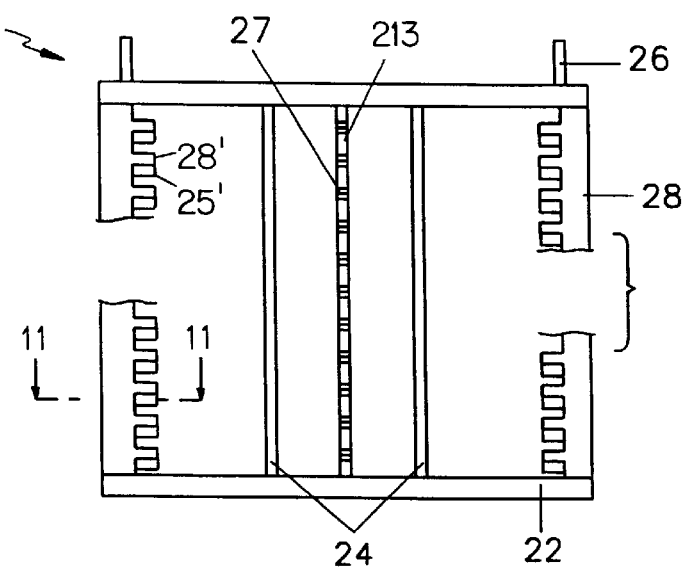
FIG. 7 is a fragmented front view of the cassette shown in FIG. 6.
Figure 11:
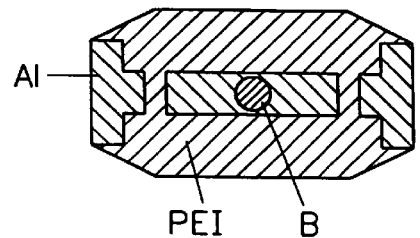
FIG. 11 is a cross sectional view of the side plate according to an embodiment of this invention.
Figure 12:
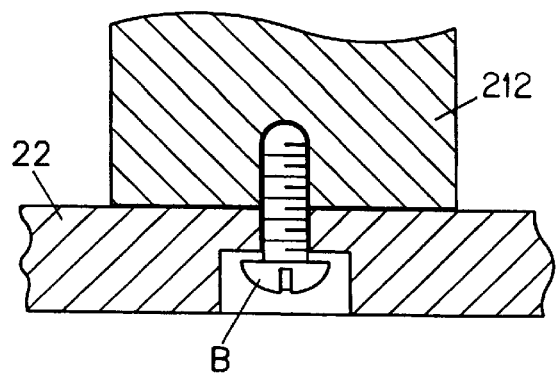
FIG. 12 shows the combined structure of the side plate and a bottom plate according to an embodiment of this invention.

In this embodiment, the top plate 23 and the bottom plate 22 are made of a conductive resin (PEI) which has surface resistance of 104–106 Q/m2. An aluminum band may be formed on the edges of the top plate 23 and the bottom plate 22. The side plates 211, 212 and 213 and the posts 24, which are connected to the top plate 23 and the bottom plate 22, and the supporting bars 27 are made of aluminum and conductive resin (PEI). The side plates 211, 212 and 213 are combined with the top plate 23 and the bottom plate 22 by metal bolts B (see FIGS. 11 and 12). FIG. 11 is a cross sectional view of the side plate taken along line 11—11 of FIG. 7, and FIG. 12 is a cross sectional view taken along line 12—12 of FIG. 6.

Figure 10:
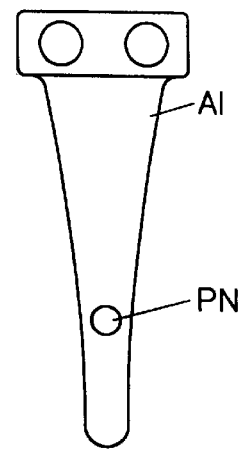
FIG. 10 is a top view of the supporting bar according to an embodiment of this invention.

Therefore, the cassette 20 is electrically connected through electrical conductors as a whole, and thus the static electricity generated on the glasses 29 and the cassette 20 is discharged if the bottom plate 22 is grounded. In this embodiment, the electrical conductor made of aluminum and coated with a resin has the surface resistance between $10^3$–$10^7$ $\Omega/m^2$. The supporting bars 27 are formed of aluminum which has elasticity to compensate for the bending of the glasses 29. The aluminum, which has the surface resistance of $10^0$–$10^2$ $\Omega/m^2$, can easily conduct the static electricity. Since an electricity protection resin (PN), which has the surface resistance of $10^{10}$–$10^{12}$ $\Omega/m^2$, is used as a material of contact portions of the supporting bars 27, which contact with the glasses 29 (see FIG. 10), the shock due to the static electricity is prevented and the static electricity is easily discharged. A plurality of the contact portions may be formed on the supporting bars 27. The supporting bar 27 is formed like a jig in this embodiment.

Now the operation of the cassette will be described. At the beginning, the blockers 28 are separated from the front side plates 211 of the cassette 20. At this stage, a user loads the glasses 29 on the cassette 20 by inserting the glasses 29 into the slots 25 of the side plates 211, 212 and 213. Then the supporting bars 27 support the glasses 20 to prevent the bending of the glasses 29. In this embodiment, even though the supporting bars 27 are used to prevent the bending of the glasses 29, the scope of this invention is not confined to the supporting bars, but extends to the structure of the side plate 213 having a prolonged protrusion longer than another protrusions to support the glasses 29. After loading the glasses 29 on the cassette 20, the user combines the blockers 28 with the front side plates 211 of the cassette 20 by using the bolts B to prevent the drifting away of the glasses 29 via front side of the cassette 20. The handle 26 is used for carrying the cassette 20. The static electricity generated on the glasses 29 and the cassette 20 is discharged through the conductive material, aluminum, formed on the top plate 23, the bottom plate 22, the side plates 211, 212 and 213 and the supporting bars 27. The value of static electricity of the glasses 29 and the cassette 20 are measured before and after discharging, and the results are shown in table 4.

TABLE 4

|  | DISCHARGED | UNIT: kV<br>CHARGED |
|---|---|---|
| MAXIMUM VALUE | 1.30 | 2.98 |
| MINIMUM VALUE | 0.55 | 1.44 |

As shown in table 4, the static electricity after the discharging is greatly lower than before the discharging. In this embodiment, the aluminum is used as a conductive material to discharge the static electricity. However, a PEEK NATURAL can be used as a material of the contact portions to suppress the occurrence of the static electricity on the glasses. (See FIG. 10). The PEEK NATURAL is generally known as an electricity protection material, and the glasses 29 contact the contact portions of the supporting bars 27.

A main advantage of the cassette of this invention is to prevent the bending of the glasses due to their weights. Other advantages of the cassette of this invention are to discharge the static electricity formed on the glasses and cassette, and to prevent the drifting away of the glasses via front side of the cassette. While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A cassette for loading glasses for a liquid crystal display device, the cassette comprising
   a top plate;
   a bottom plate opposite said top plate;
   a plurality of side plates each extending between a respective corner of said top plate and said bottom plate, and a pair of additional side plates extending between said top plate and said bottom plate from points intermediate those of said corners and located on opposite sides of the cassette, said additional side plates and at least said side plates located on one side of the additional side plates having a plurality of slots formed by first protrusions to permit loading the glasses from one end of the cassette;
   a post extending between said top plate and said bottom plate from points intermediate said corners located at an opposite end of the cassette from said one end to prevent the glasses from sliding out of the cassette at said opposite end; and
   a plurality of supporting bars which extend from at least one of said side plates at said opposite end of the cassette and said post to support undersides of the glasses, said bars extending towards said one end of the cassette;
   wherein said supporting bars are longer than the first protrusions and are cantilevered to support the undersides of the glasses at free ends of the supporting bars to prevent bending of the glasses and wherein at least one of said supporting bars comprises a conductive body and a conductive contact part which is formed on the body at the free end of the supporting bar to contact the glass and which has a surface resistance greater than the body.

2. The cassette according to claim 1, wherein said conductive contact part comprises PEEK NATURAL.

3. The cassette according to claim 1, wherein said plurality of side plates, said top plate, said bottom plate and said plurality of supporting bars are made of a metal conductor and a conductive resin and are electrically interconnected.

4. The cassette according to claim 1, wherein said plurality of supporting bars are formed like a jig.

5. The cassette according to claim 1, further comprising a handle on said top plate.

6. The cassette according to claim 3, wherein said resin comprises a conductive resin (PEI).

7. The cassette according to claim 3, wherein said metal conductor is made of aluminum and when coated with a said conductive resin has a surface resistance between $10^3$–$10^7$ $\Omega/m^2$.

8. A cassette for loading glasses for a liquid crystal display device, the cassette comprising:
   a top plate;
   a bottom plate opposite said top plate;
   a plurality of side plates each extending between a respective corner of said top plate and said bottom plate, and a pair of additional side plates extending between said top plate and said bottom plate from points intermediate those of said corners and located on opposite sides of the cassette, said additional side plates and at least said side plates located on one side of the additional side plates having a plurality of slots formed by first protrusions to permit loading of the glasses from one end of the cassette;
   a blocker which is combined with at least one of said side plates at said one end of the cassette, said blocker having a plurality of second protrusions located adjacent and outwardly of the first protrusions, and placed at higher positions than the first protrusions, to prevent the glasses loaded into said slots from sliding out of said one end of the cassette;
   a post extending between said top plate and said bottom plate from points intermediate said corners located at an opposite end of the cassette from said one end of the cassette to prevent the glasses from sliding out of the cassette at said opposite end; and
   a plurality of supporting bars which extend from at least one of said side plates at said opposite end of the cassette and said post to support undersides of the glasses, said bars extending towards said one end of the cassette;
   wherein said supporting bars are longer than the first protrusions and are cantilevered to support the undersides of the glasses at the free ends of the supporting bars to prevent bending of the glasses.

9. The cassette according to claim 8, wherein said plurality of side plates, said top plate, said bottom plate and said plurality of supporting bars are made of a metal conductor and a conductive resin and are electrically interconnected.

10. The cassette according to claim 8, wherein said plurality of supporting bars are formed like a jig.

11. The cassette according to claim 8, further comprising a handle on said top plate.

12. The cassette according to claim 9, wherein said resin comprises a conductive resin (PEI).

13. The cassette according to claim 9, wherein said metal conductor is made of aluminum and when coated with said conductive resin has a surface resistance between $10^3$–$10^7$ $\Omega/m^2$.

14. The cassette according to claim 8, wherein said blocker is combined with said side plate at the one end of the cassette by screws.

* * * * *